United States Patent
Park et al.

(10) Patent No.: US 10,079,276 B2
(45) Date of Patent: Sep. 18, 2018

(54) ORGANIC LIGHT EMITTING DISPLAY PANEL COMPRISING PIXEL REPAIR REGION

(71) Applicant: LG Display Co., Ltd., Seoul (KR)

(72) Inventors: JuneHo Park, Gyeonggi-do (KR); EunMi Jo, Gyeonggi-do (KR); Daehyun Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/571,638

(22) Filed: Dec. 16, 2014

(65) Prior Publication Data

US 2016/0049454 A1    Feb. 18, 2016

(30) Foreign Application Priority Data

Aug. 14, 2014  (KR) .................. 10-2014-0105970

(51) Int. Cl.
| | | |
|---|---|---|
| H01L 29/04 | (2006.01) | |
| H01L 29/10 | (2006.01) | |
| H01L 31/00 | (2006.01) | |
| H01L 27/32 | (2006.01) | |
| H01L 51/52 | (2006.01) | |

(52) U.S. Cl.
CPC ...... *H01L 27/3272* (2013.01); *H01L 27/3276* (2013.01); *H01L 51/5284* (2013.01); *H01L 2251/568* (2013.01)

(58) Field of Classification Search
CPC . H01L 51/0545; H01L 27/1214; H01L 27/12; H01L 27/3272; H01L 51/5284; B82Y 10/00
USPC .................................................... 257/40, 59
See application file for complete search history.

(56) References Cited

U.S. PATENT DOCUMENTS

| | | | | |
|---|---|---|---|---|
| 5,744,821 A | * | 4/1998 | Song ................ | H01L 29/78633 257/59 |
| 5,808,714 A | * | 9/1998 | Rowlands ......... | G02F 1/133512 349/105 |
| 2004/0125265 A1 | * | 7/2004 | Koo ........................ | C30B 1/023 349/56 |
| 2004/0155245 A1 | * | 8/2004 | Okumura ............ | H01L 29/0603 257/66 |
| 2005/0242713 A1 | * | 11/2005 | Yamazaki ........... | H01L 51/5284 313/503 |

(Continued)

FOREIGN PATENT DOCUMENTS

| | | |
|---|---|---|
| CN | 1288715 C | 12/2006 |
| CN | 1311563 C | 4/2007 |
| CN | 100578806 C | 1/2010 |

OTHER PUBLICATIONS

Office Action issued in corresponding Chinese Patent Application No. 201410858246.2 dated Dec. 5, 2017.

*Primary Examiner* — Lex Malsawma
*Assistant Examiner* — Eric W Jones
(74) *Attorney, Agent, or Firm* — Morgan, Lewis & Bockius LLP

(57) ABSTRACT

An organic light emitting display panel is provided that comprises a substrate comprising an emission area and a non-emission area; a black matrix disposed on the non-emission area and comprising at least one open area that exposes at least a portion of a pattern formed on the substrate, wherein the pattern or the exposed portion of the pattern comprises a multi-layer structure comprising a conductive layer and at least one low reflective layer.

8 Claims, 16 Drawing Sheets

(56) References Cited

U.S. PATENT DOCUMENTS

| | | | | |
|---|---|---|---|---|
| 2006/0113900 A1* | 6/2006 | Oh | ................... | H01L 27/3276 313/504 |
| 2011/0127499 A1* | 6/2011 | Yoon | ................ | H01L 27/3272 257/40 |
| 2013/0119387 A1* | 5/2013 | Park | ................ | H01L 51/5284 257/59 |
| 2014/0183476 A1* | 7/2014 | Kwon | ............... | H01L 29/78603 257/40 |
| 2014/0339521 A1* | 11/2014 | Ozawa | ............... | H01L 51/5228 257/40 |
| 2015/0055051 A1* | 2/2015 | Osawa | ............... | H01L 27/1225 349/48 |

* cited by examiner

C AREA

I-V EVALUATION

FIG.9A

[UNIT: nm]

| NO. | Ra | Rg |
|-----|------|------|
| #1  | 21.2 | 26.4 |
| #2  | 13.2 | 16.5 |
| #3  | 3.4  | 4.3  |
| #4  | 3.3  | 4.3  |
| #5  | 0.5  | 0.6  |
| #6  | 0.2  | 0.4  |

ORGANIC LIGHT EMITTING DISPLAY PANEL COMPRISING PIXEL REPAIR REGION

CROSS-REFERENCE TO RELATED APPLICATION

This application claims priority from and the benefit under 35 U.S.C. § 119(a) of Korean Patent Application No. 10-2014-0105970, filed on Aug. 14, 2014, which is hereby incorporated by reference for all purposes as if fully set forth herein.

BACKGROUND OF THE INVENTION

Field of the Invention

The present invention relates to an organic light emitting display (OLED) panel.

Description of the Prior Art

Liquid Crystal Display (LCD) devices, which are lightweight and consume a small amount of power, have been commonly utilized in the fields of flat panel display devices. However, the LCD display is a non-emissive device which does not generate light by itself, and has drawbacks associated with brightness, contrast ratio, viewing angle, enlargement, and the like.

Accordingly, a new flat display device that may overcome the drawbacks of the LCD device has been actively researched. An organic light emitting display (OLED) device, as one of the new flat display devices, is a light emitting device that generates light by itself and thus, has excellent brightness, viewing angle, and contrast ratio properties, in comparison with the existing LCD device. Also, the OLED device does not need a backlight, and thus may be designed to be lightweight and thin and is advantageous from the perspective of power consumption.

An OLED panel of the OLED device displays an image using light emitted from an organic light emitting device connected to a thin film transistor of each pixel area. The light emitting device forms an organic light emitting layer that is formed of organic compounds, between an anode and a cathode, and corresponds to a device that generates light by applying an electromagnetic field, is driven by a low voltage, consumes a relatively small amount of power, is lightweight, and is manufactured on top of a flexible substrate.

A light emitting scheme associated with a direction of emission of an OLED device is classified into a top emission scheme and a bottom emission scheme. According to the bottom emission scheme, when a pixel (P) malfunctions, there is difficulty in specifying the repair location through a black matrix. Also, the electric properties of a transistor are deteriorated due to the uneven surface of the black matrix.

SUMMARY OF THE INVENTION

In this background, an aspect of the present invention is to provide an OLED panel that readily executes repairs when a pixel malfunctions, and improves electric properties.

As described above, according to the present invention, an OLED panel is readily repaired and electric properties are improved.

An aspect of the invention is an organic light emitting display panel, comprising a substrate comprising an emission area and a non-emission area;
a black matrix disposed on the non-emission area and comprising at least one open area that exposes at least a portion of a pattern formed on the substrate, wherein the pattern or the exposed portion of the pattern comprises a multi-layer structure comprising a conductive layer and at least one low reflective layer.

Another aspect of the invention is organic light emitting display panel, comprising a display panel comprising a plurality of pixels formed at intersection points between a plurality of data lines and a plurality of gate lines; and a black matrix comprising an open area disposed on an emission area exposing an emission area of each of the pixels, wherein at least one pixel from the plurality of pixels is a pixel from which a portion of a pattern is cut, and wherein the black matrix further comprises an open area disposed on a non-emission area that exposes the cut portion.

In an exemplary embodiment, the open area exposes a portion of at least one of a signal line, a transistor electrode and a pixel electrode formed on the substrate.

In an exemplary embodiment the open area exposes a portion of a shielding layer formed between a layer in which a transistor is formed and a different layer in which the black matrix is formed.

In an exemplary embodiment, the open area is a marker for location of pixel repair.

In an exemplary embodiment, the open area corresponds to a semi-conductive layer of the transistor.

In an exemplary embodiment, the open area corresponds to at least a portion of the shielding layer.

In an exemplary embodiment, at least one low reflective layer comprises a metallic oxide or a material that absorbs light introduced from outside the substrate, or is coated with a light absorbent.

In an exemplary embodiment, the at least one low reflective layer comprises a first layer comprising a metallic oxide and a second layer comprising a material that absorbs light.

In an exemplary embodiment, the light introduced through the substrate is non-polarized light.

In an exemplary embodiment, the black matrix comprises heat-tolerant organic matter.

BRIEF DESCRIPTION OF THE DRAWINGS

The above and other objects, features and advantages of the present invention will be more apparent from the following detailed description taken in conjunction with the accompanying drawings, in which:

FIG. 3AA represents the NEA portion remaining in the C Area of the OLED panel of FIG. 3A after exclusion of the EA from a pixel (P).

FIGS. 9A and 9B are a table and a graph illustrating roughness, which is different for each type of black matrix of an OLED panel according to another embodiment of the present invention.

DETAILED DESCRIPTION OF THE INVENTION

Figure 1:
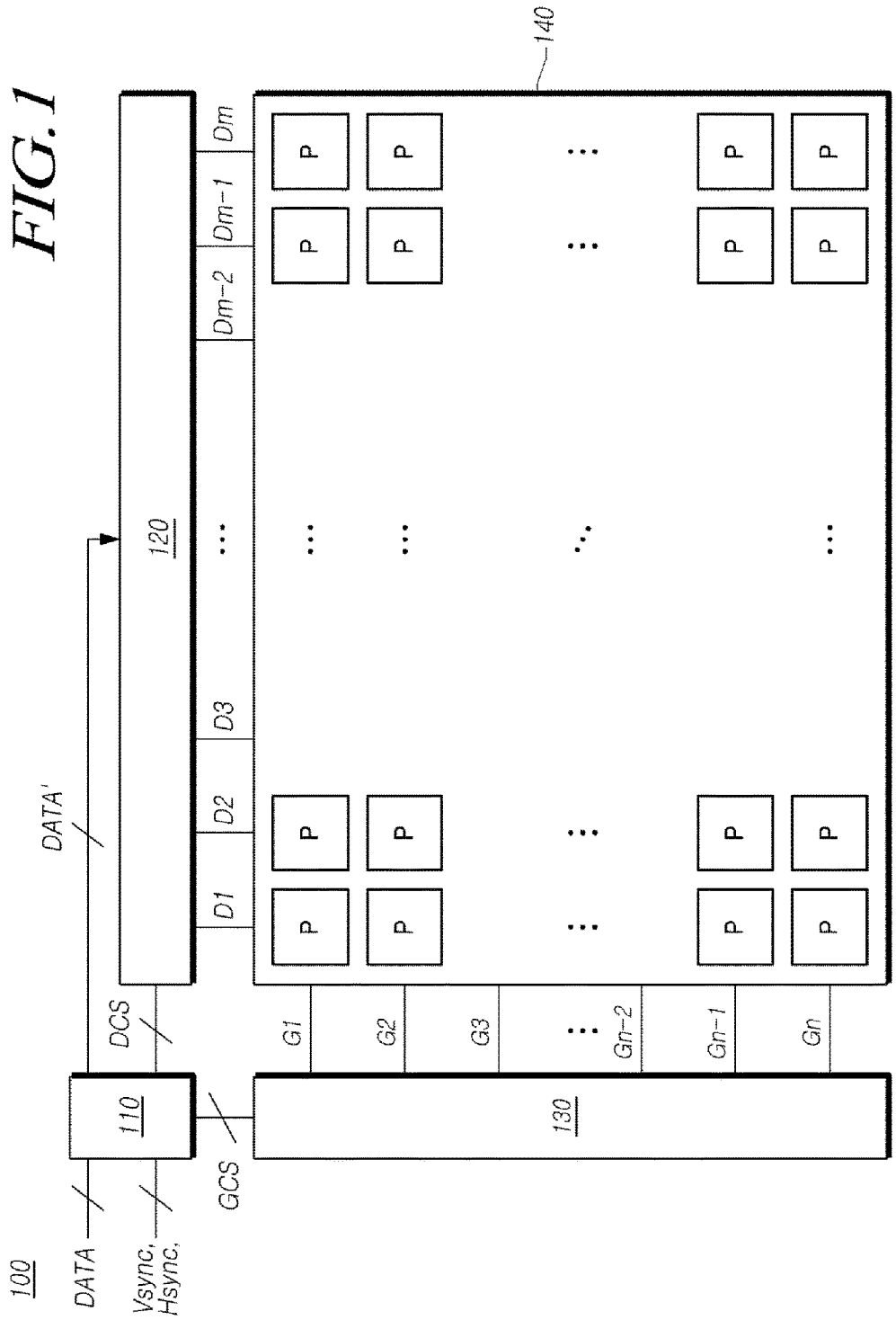
FIG. 1 is a diagram illustrating a system of an OLED device to which embodiments of the present invention are applied.

Hereinafter, exemplary embodiments of the present invention will be described with reference to the accompanying drawings. In the following description, the same elements will be designated by the same reference numerals although they are shown in different drawings. Further, in the following description of embodiments of the present invention, a detailed description of known functions and configurations incorporated herein will be omitted when it may make the subject matter of the present invention unclear.

In addition, terms, such as first, second, A, B, (a), (b) or the like may be used herein when describing components of the present invention. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

FIG. 1 is a diagram illustrating a system of an OLED device to which embodiments of the present invention are applied.

Referring to FIG. 1, an OLED device 100 includes an OLED panel 140, a data driving unit 120, a gate driving unit 130, a timing controller 110, and the like.

First, the timing controller 110 outputs a Data Control Signal (DCS) for controlling the data driving unit 120 and a Gate Control Signal (GCS) for controlling the gate driving unit 130, based on an external timing signal, such as a vertical/horizontal synchronizing signal (Vsync and Hsync), image data, a clock signal (CLK), and the like. Also, the timing controller 110 converts image data (data) input from a host system into a data signal format that is used in the data driving unit 120, and provides the converted image data (data') to the data driving unit 120.

In response to a DCS and the converted image data (data') input from the timing controller 110, the data driving unit 120 converts the image data (data') to a data signal (analog pixel signal or data voltage), which is a voltage value corresponding to a gray scale value, and provides the same to a data line (D1~Dm).

The gate driving unit 130 sequentially supplies a scan signal (a gate pulse or a scan pulse, and a gate-on signal) to a gate line (G1~Gn) in response to the GCS input from the timing controller 110.

Each pixel (P) on the OLED panel 140 may be formed in a pixel area defined by the data lines (D1~Dm) and the gate lines (G1~Gn) and may be disposed in a matrix form, and may correspond to at least one organic light emitting device including an anode corresponding to a first electrode, a cathode corresponding to a second electrode, and an organic layer.

The gate lines G1 to Gn, the data lines D1 to Dm and high potential voltage lines for supplying a high potential voltage are formed in each pixel P. Further, in each pixel P, a switching transistor is formed between the gate lines G1 to Gn and the data lines D1 to Dm, and an organic light emitting diode comprised of a positive electrode, a negative electrode and an organic light emitting layer is formed. Furthermore, a driving transistor is formed between a source electrode (or drain electrode) of the switching transistor and the high potential voltage lines in each pixel.

Also, the OLED panel 140 may include a black matrix (not illustrated) between a Non Emission Area (NEA) of each pixel (P) and a corresponding pixel (P). The black matrix (not illustrated) may shield light introduced from the outside. The black matrix (not illustrated) includes an Open Area (OA) for repair when a pixel (P) malfunctions, and signal lines or electrodes exposed by the OA may include a low reflective structure for shielding light from the outside.

A semi-conductive layer of a transistor is vulnerable to an external environment such as light introduced from the outside and thus, may include a shielding layer (not illustrated), and the shielding layer (not illustrated) may also include a low reflective structure.

A surface of the black matrix (not illustrated) may be provided in an uneven shape depending on a manufacturing process. When the shape of the black matrix (not illustrated) is applied to the semi-conductive layer of the transistor, electric properties are deteriorated and thus, an OA of the black matrix (not illustrated) may be disposed in a lower portion of the semi-conductive layer. In this instance, the deterioration of the properties of the semi-conductive layer, caused by light introduced from the outside, may be prevented by the shielding layer.

The OLED panel 140 may be based on a bottom emission scheme. Here, the bottom emission scheme refers to a scheme in which emitted light proceeds in a direction of a substrate of the bottom of the OLED panel 140 from a pixel electrode (not illustrated).

Hereinafter, this will be described in detail with reference to the drawings.

Figure 2:
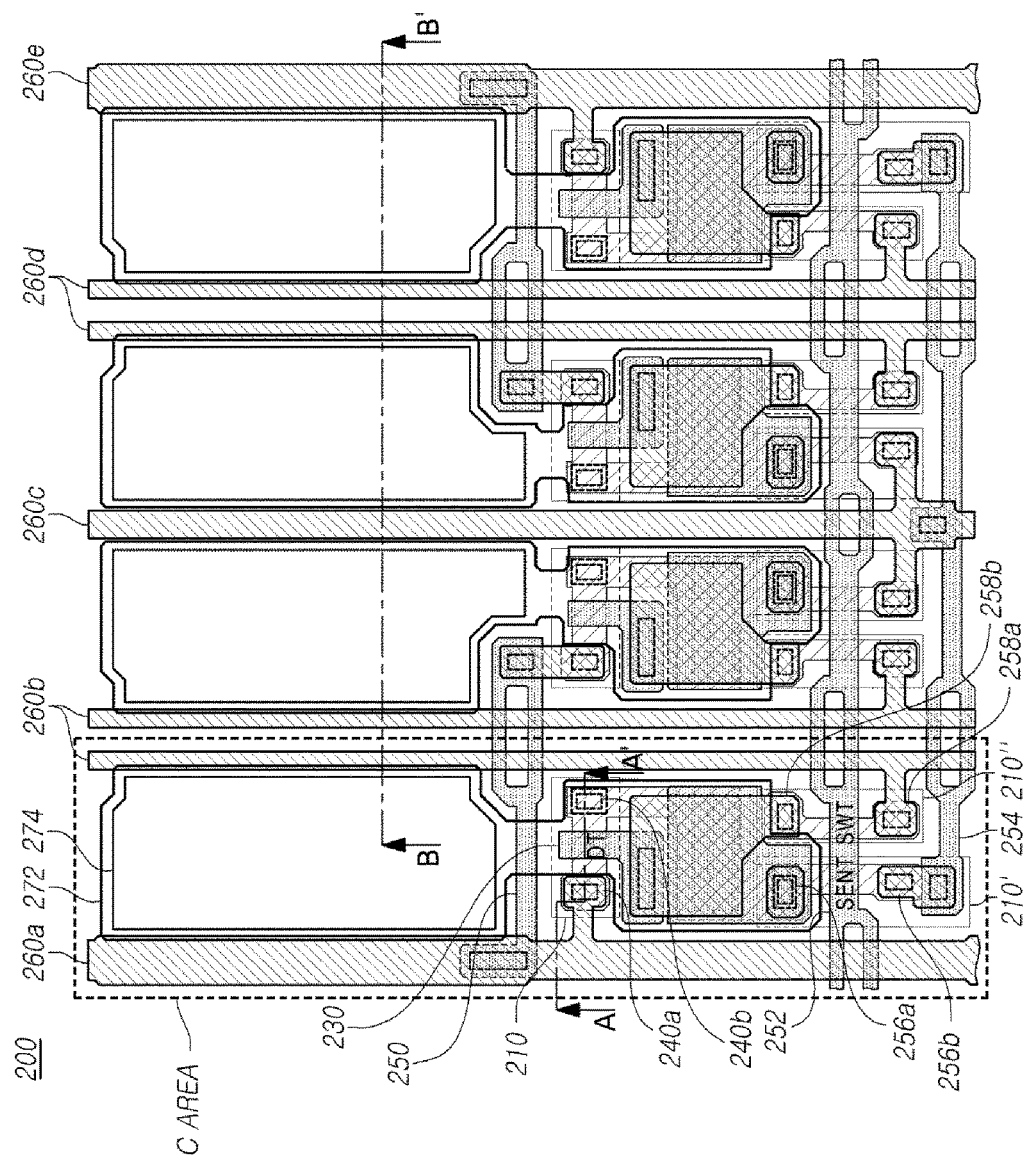
FIG. 2 is a schematic floor plan of an OLED panel according to an embodiment of the present invention.

FIG. 2 illustrates a schematic floor plan of an OLED panel according to an embodiment of the present invention. An OLED panel 200 is illustrated in a 3T 1C structure, including three transistors and a single scan line. The OLED panel 200 of FIG. 2 is merely exemplified for ease of description, and the OLED panel 200 may be designed in various structures. For example, the OLED panel 200 may be in a 2T 1C structure, a 3T 2C structure, or the like.

Referring to FIG. 2, the OLED panel 200 may include a substrate 202 formed of an Emission Area (EA) and a Non Emission Area (NEA), and a black matrix (not illustrated) including one or more OAs (not illustrated) that are disposed on the NEA and expose at least a part of a pattern 250, 252, 254, 260*a*, 260*b*, 260*c*, 260*d*, 260*e*, 230, 252, 240*a*, 240*b*, 256*a*, 256*b*, 258*a*, and 258*b* formed on the substrate 202.

Here, the entire pattern 250, 252, 254, 260*a*, 260*b*, 260*c*, 260*d*, 260*e*, 230, 252, 240*a*, 240*b*, 256*a*, 256*b*, 258*a*, and 258*b* or a part exposed through an OA (not illustrated) from the pattern 250, 252, 254, 260*a*, 260*b*, 260*c*, 260*d*, 260*e*, 230, 252, 240*a*, 240*b*, 256*a*, 256*b*, 258*a*, and 258*b* may have a multi-layer structure, formed of a conductive layer (not illustrated) and one or more low reflective layers (not illustrated).

The OA (not illustrated) may expose a part of at least one of a signal line 250, 252, 254, 260*a*, 260*b*, 260*c*, 260*d*, and 260*e*, a transistor electrode 230, 252, 240*a*, 240*b*, 256*a*, 256*b*, 258*a*, and 258*b*, and a pixel electrode 272.

Also, the OA (not illustrated) may expose a part of a shielding layer 210, 210', and 210" formed between a layer where a transistor (DT, SENT, SWT) is formed and a layer where a black matrix (not illustrated) is formed, on the substrate 202.

First, the OLED panel 200 may include a plurality of signal lines on the substrate 202, and a first line 260*a*, a second line 260*b*, a third line 260*c*, a fourth line 260*d*, and a fifth line 260*e* are disposed in parallel to be spaced apart from one another in a first direction (the vertical direction of FIG. 2).

The first line 260*a* and the fifth line 260*e* may correspond to a high voltage power line (VDD), the second line 260*b* and the fourth line 260*d* may correspond to a data line, and the third line 260*c* may correspond to a reference voltage line, but these are not limited thereto.

A sixth line 250, a seventh line 252, and an eighth line 254 are disposed in parallel to be spaced apart from one another in a second direction (the horizontal direction of FIG. 2). Here, the sixth line 250 is connected to the first line 260*a* and a contact hole, so as to provide high voltage power to an adjacent sub-pixel. The seventh line 252 may be a gate line (or scan line), and the eighth line 254 may be connected to the third line 260*c*, which is a reference voltage line, and a contact hole, so as to supply a reference voltage to adjacent sub-pixels.

Here, the sixth line 250, the seventh line 252, and the eighth line 254 may have a redundancy structure for repair. The redundancy structure corresponds to a structure in which lines for an identical function are formed redundantly.

Each sub-pixel may include transistors (DT, SENT, and SWT).

A first transistor (DT) may be a driving transistor that drives the pixel electrode 272, and the first transistor (DT) may include a first gate electrode 230 and a first source electrode 240*b*/first drain electrode 240*a*.

A second transistor (SENT) may be a sensing transistor, and may include a second gate electrode 252 and a second source electrode 256*b*/second drain electrode 256*a*. One end of the second transistor (SENT) is connected to a storage capacitor (Cstg) and the other end is connected to the eighth line 254.

A third transistor (SWT) may be a switching transistor, and may include a third gate electrode 252 and a third source electrode 258*b*/third drain electrode 258*a*. One end of the third transistor (SWT) is connected to the second line 260*b*, and the other end is connected to the first gate electrode 230 of the first transistor (DT) through a contact hole.

According to an electric function of the OLED panel 200, the third transistor (SWT) is turned on by a scan signal provided from the sixth line 252, and transfers a data signal provided through the second line 260*b* to the first gate electrode 230 of the first transistor (DT). The storage capacitor (Cstg) stores a data signal provided through the third transistor (SWT), so as to maintain the second transistor (SENT) to be turned on for at least a predetermined period of time (one frame). Also, the first transistor (DT) is driven based on a data signal stored in the storage capacitor (Cstg). In other words, the first transistor (DT) controls a driving current or a driving voltage provided to the pixel electrode 272, based on the data signal.

When the first transistor (DT) is driven, a light emitting layer (not illustrated) of an organic layer (not illustrated) may emit light by current provided through the first line 260*a*. While a driving current provided through the driving transistor (DT) is transferred to the pixel electrode 272 and flows through the organic layer (not illustrated), an electron and a hole are re-coupled and light is emitted, and finally, the same flows out to a common electrode (not illustrated).

The OLED panel 200 includes the pixel electrode 272 and a common electrode (not illustrated) that faces the pixel electrode 272 and is formed to be spaced apart from the pixel electrode 272, and includes a bank 274 formed on an edge area of the pixel electrode 272.

Each transistor (DT, SENT, SWT) of the OLED panel 200 according to embodiments of the present invention may be an oxide transistor of which a semi-conductive layer is formed of a metallic oxide, and shielding layers 210, 210', and 210" may be formed in an area corresponding to the semi-conductive layer of each transistor (DT, SENT, SWT). In a case of the oxide transistor, when light enters into a semi-conductive layer from the outside, electric or chemical properties may be changed. This will be described in detail in the description associated with a related drawing.

A low reflective layer (not illustrated) may be formed of a material that absorbs light introduced from the outside through the substrate 202, or may be coated with a light absorbent.

Embodiments of the present invention embody a structure that excludes a polarizing plate, polarizing layer, or the like and thus, the light introduced from the outside indicates non-polarized light. In general, light introduced from the outside may be shielded by including a polarizing plate, a polarizing layer, or the like. In the case of the OLED panel 200 according to embodiments of the present invention, a separate structure for shielding light introduced from the outside may be required. The separate external light shielding structure corresponds to a low reflective layer (not illustrated), which will be described in detail with reference to a related drawing.

Also, the low reflective layer (not illustrated) may be formed of a metallic oxide, a metal that absorbs light, or an alloy thereof, and may have a color similar to black.

Figure 3A:
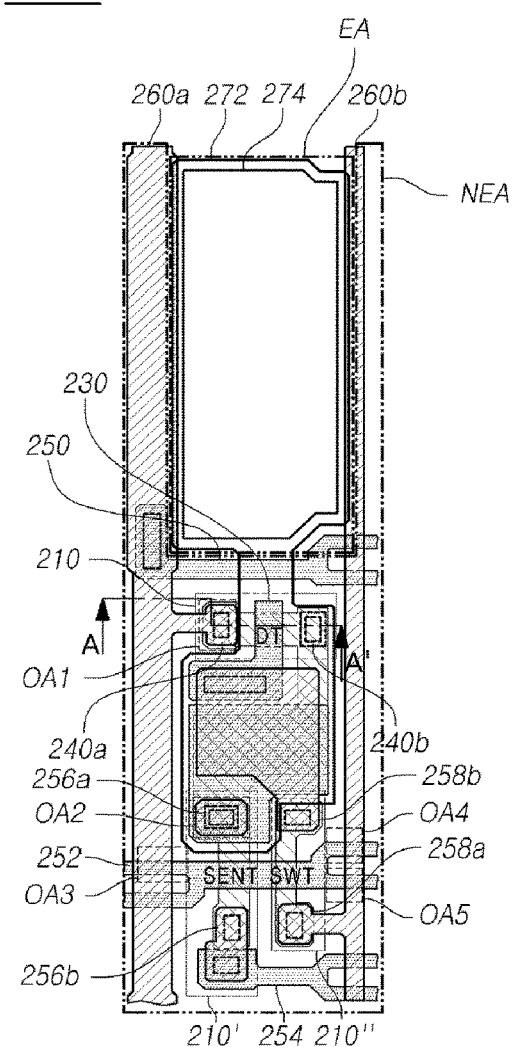
FIG. 3A is a schematic floor plan of an example of the C Area of an OLED panel according to another embodiment of the present invention.
Figure 3A:
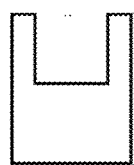
Figure 3B:
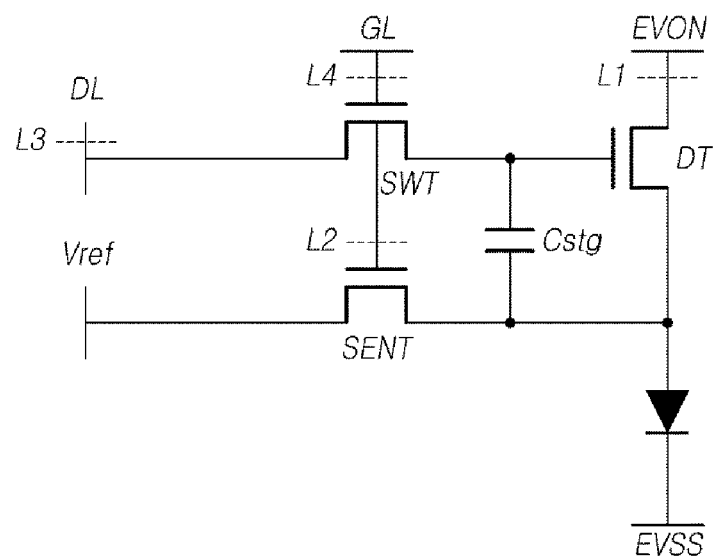
FIG. 3B is a circuit diagram of the OLED panel of FIG. 3A.
Figure 3C:
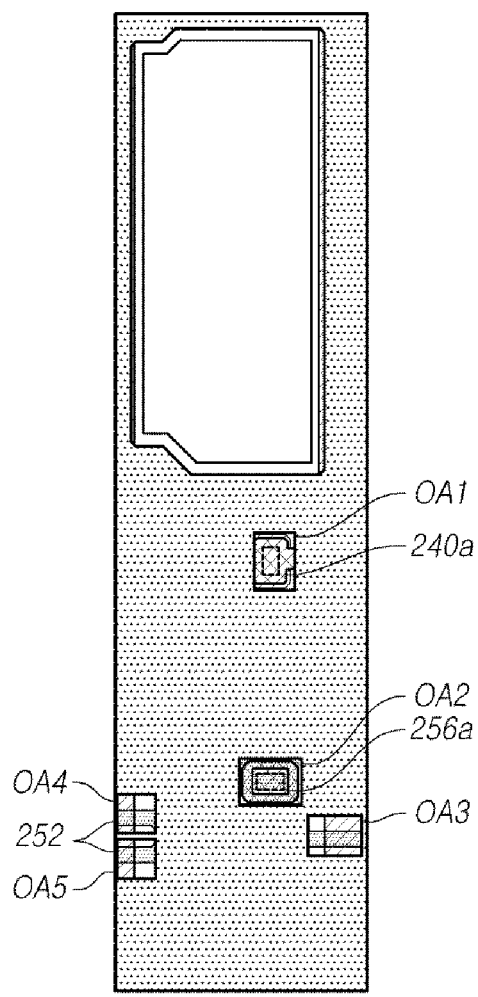
FIG. 3C is a schematic floor plan of the OLED panel of FIG. 3A, viewed in the opposite direction.

FIG. 3A is a schematic floor plan illustrating an example of the C Area of an OLED panel according to another embodiment of the present invention, FIG. 3B is a circuit diagram of the OLED panel of FIG. 3A, and FIG. 3C is a schematic floor plan illustrating the OLED panel of FIG. 3A, viewed in the opposite direction.

Referring to FIGS. 3A through 3C, the OLED panel 200 may include the substrate 202 formed of an EA and an NEA, and the black matrix 204 including one or more OAs (OA1, OA2, OA3, OA4, and OA5) that are located in the NEA and expose at least a part of the pattern 250, 252, 254, 260*a*, 260*b*, 260*c*, 260*d*, 260*e*, 230, 252, 240*a*, 240*b*, 256*a*, 256*b*, 258*a*, 258*b*, and 272 formed on the substrate 202. The entire pattern 250, 252, 254, 260*a*, 260*b*, 260*c*, 260*d*, 260*e*, 230, 252, 240*a*, 240*b*, 256*a*, 256*b*, 258*a*, 258*b*, and 272 or a part exposed through the OAs (OA1, OA2, OA3, OA4, and OA5) from the pattern 250, 252, 254, 260*a*, 260*b*, 260*c*, 260d, 260e, 230, 252, 240a, 240b, 256a, 256b, 258a, 258b, and 272 may have a multi-layer structure formed of a conductive layer and one or more low reflective layers.

Here, the EA is a part where the pixel electrode 272 exposed by the bank 274 is located, and corresponds to an area provided in a rectangular shape, which is marked by a two-dot chain line of FIG. 3A. Conversely, the NEA is a part remaining after excluding the EA from a pixel (P), and corresponds to an area formed in the shape as depicted in FIG. 3AA.

The OA (OA1, OA2, OA3, OA4, and OA5) may expose a part of at least one of the signal line 250, 252, 254, 260a, 260b, 260c, 260d, and 260e, the transistor electrode 230, 252, 240a, 240b, 256a, 256b, 258a, and 258b, and the pixel electrode 272, formed on the substrate 202. OA denotes an open area.

Here, the OA (OA1, OA2, OA3, OA4, and OA5) may be a marker that provides guidance to a pixel repair location. In other words, through the OA (OA1, OA2, OA3, OA4, and OA5), cutting or welding repair may be executed through laser or the like. In this instance, the OA may act as a marker, that is, an indicator.

The repair may be executed through a side through which emitted light comes out to the outside, as shown in FIG. 3C. In other words, in a case of the OLED panel 200 based on the bottom emission scheme, laser is emitted from the bottom of the substrate 202 of the OLED panel 200 so that cutting or welding may be executed. In particular, when a bright spot is generated, cutting may be executed so as to change the same to be a dark spot. When a dark spot is generated, welding may be executed so as to normalize the same. Accordingly, when the marker such as the OA (OA1, OA2, OA3, OA4, and OA5) does not exist, repair processing through the black matrix 204 formed on the entire area of the NEA may not be executed.

In particular, a first OA (OA1) may expose the first drain electrode 240a of the first transistor (DT). When the first transistor (DT) has a defect, the first OA (OA1) may be a marker that indicates a repair area associated with the defect. In other words, a part between a high voltage power line and the first transistor (DT) may be cut along L1 line of FIG. 3B, through the first OA (OA1).

In the same manner, a second OA (OA2) exposes the second drain electrode 256a of the second transistor (SENT), and a third OA (OA3) exposes the seventh line 252, and a fourth OA (OA4) and a fifth OA (OA5) also expose the seventh line 252. From the perspective of a circuit, a part (L2) between a gate line (GL) and the second transistor (SENT), a part (L3) between a data line (DL) and the third transistor (SWT), and a part between the gate line (GL) and the third transistor (SWT) may be cut, respectively.

The OA (OA1, OA2, OA3, OA4, and OA5) is merely exemplified for ease of description, and areas repaired by the marker may not be limited thereto and variously exist.

The black matrix 204 is formed of organic compounds having heat tolerance. For example, the bank 274 may be a high polymer of the polyimide family or a high polymer of the siloxane family, but may not be limited thereto.

In a case of the black matrix 204 having heat tolerance, the black matrix 204 may endure a high temperature environment without being modified or altered, during a manufacturing process of the black matrix 204 or a manufacturing process of other layers.

The OA (OA1, OA2, OA3, OA4, and OA5) may expose a part of the shielding layer 210, 210', and 210" formed between a layer where the transistor (DT, SENT, SWT) is formed and a layer where the black matrix 204 is formed, on the substrate 202.

Here, the shielding layer 210, 210', and 210" may be formed to correspond to conductive layers of the transistor (DT, SENT, and SWT), but it may not be limited thereto, and may be formed as the OLED panel 200

During the manufacturing process of the black matrix 204 of the OLED panel 200, when a patterning process or curing process is executed, a surface of the black matrix 204 may become uneven. In other words, the black matrix 204 may have a surface having roughness. Accordingly, a shape of the surface of the black matrix 204 may be transcribed to the surfaces of layers formed on the black matrix 204.

When the transistor (DT, SENT, and SWT) is formed with the defect included in the manufacturing process, the electric properties may be deteriorated. For example, due to the uneven surface of a semi-conductive layer of a transistor (DT, SENT, and SWT), a movement distance of an electron increases and a mobility of an electron may be deteriorated.

Accordingly, the OLED panel 200 manufactured through the above described manufacturing process may have at least one pixel (P) of which a part exposed through an OA (OA1, OA2, OA3, OA4, and OA5) is cut.

Figure 4A:
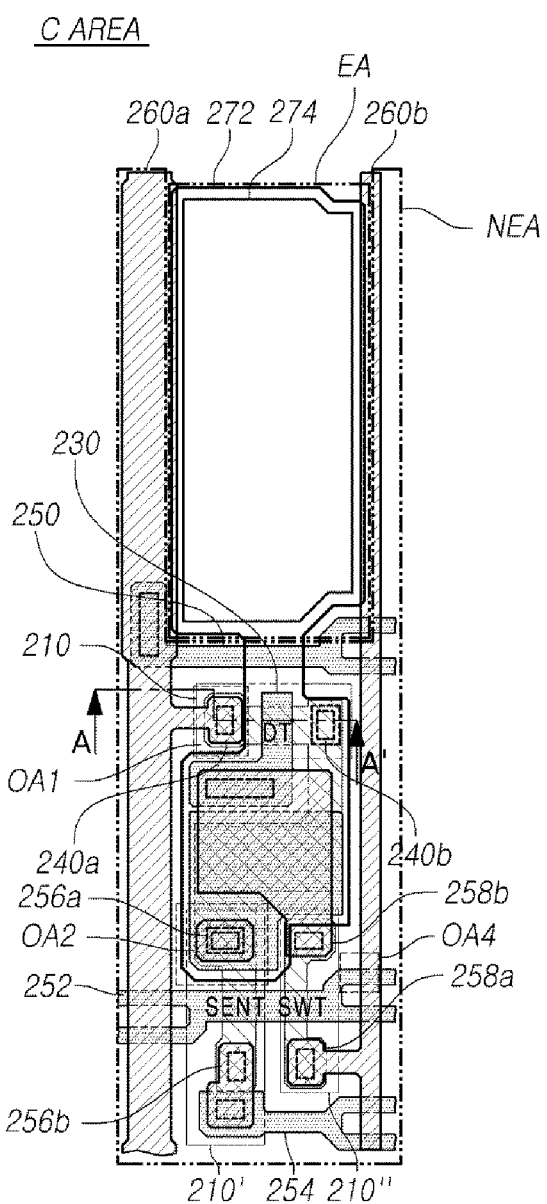
FIG. 4A is a schematic floor plan of another example of the C Area of an OLED panel according to another embodiment of the present invention.
Figure 4B:
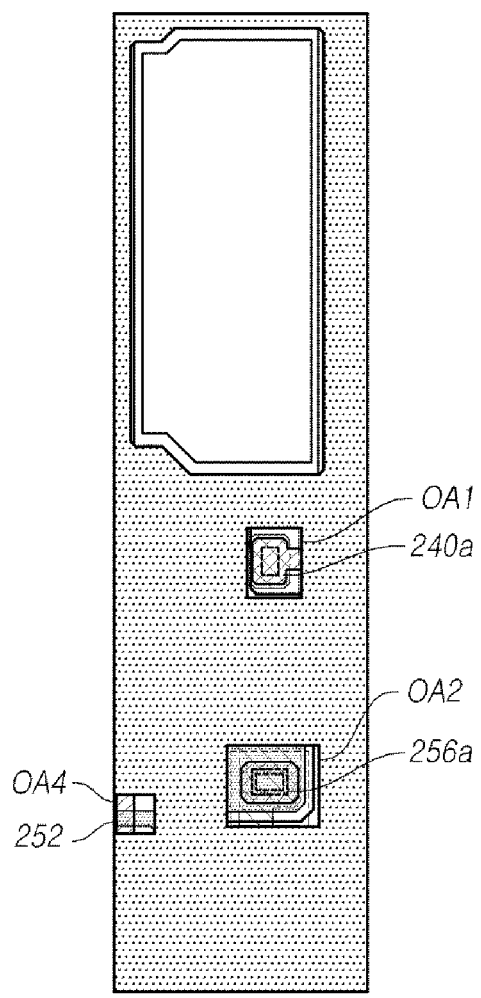
FIG. 4B is a schematic floor plan of the OLED panel of FIG. 4A, viewed in the opposite direction.

FIG. 4A is a schematic floor plan illustrating another example of the C Area of an OLED panel according to another embodiment of the present invention, and FIG. 4B is a schematic floor plan illustrating the OLED panel of FIG. 4A, viewed in the opposite direction.

Referring to FIGS. 4A and 4B, the OLED panel 200 may include a first OA (OA1), a second OA (OA2), and a fourth OA (OA4), in an NEA.

Here, the first OA (OA1) may expose a part of the pixel electrode 272 and the first drain electrode 240a of the first transistor (DT), and the second OA (OA2) may expose a part of the pixel electrode 272 and the second drain electrode 256a of the second transistor (SENT), and the fourth OA (OA4) may expose a part of the seventh line 252 which is a gate line.

In addition, the first OA (OA1) and the second OA (OA2), and the fourth OA (OA4) may act as a marker or an indicator for cutting or welding.

The OA (OA1, OA2, OA3, OA4, and OA5) of the OLED panel 200 of FIGS. 3A through 4B is merely exemplified for ease of description, and the OA may be formed in various areas.

Figure 5A:
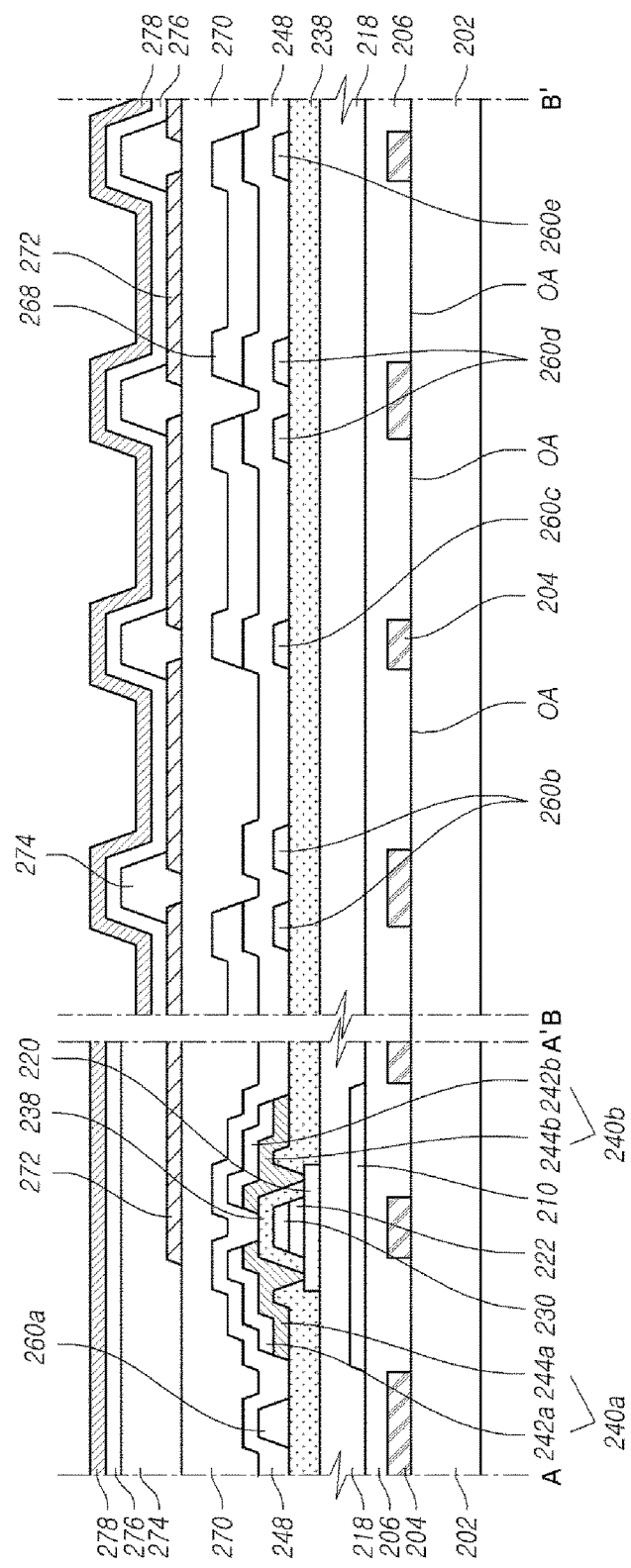
FIGS. 5A through 5C are schematic sectional views of an OLED panel that is cut along A-A' and B-B' of FIG. 2, according to other embodiments of the present invention.
Figure 5B:
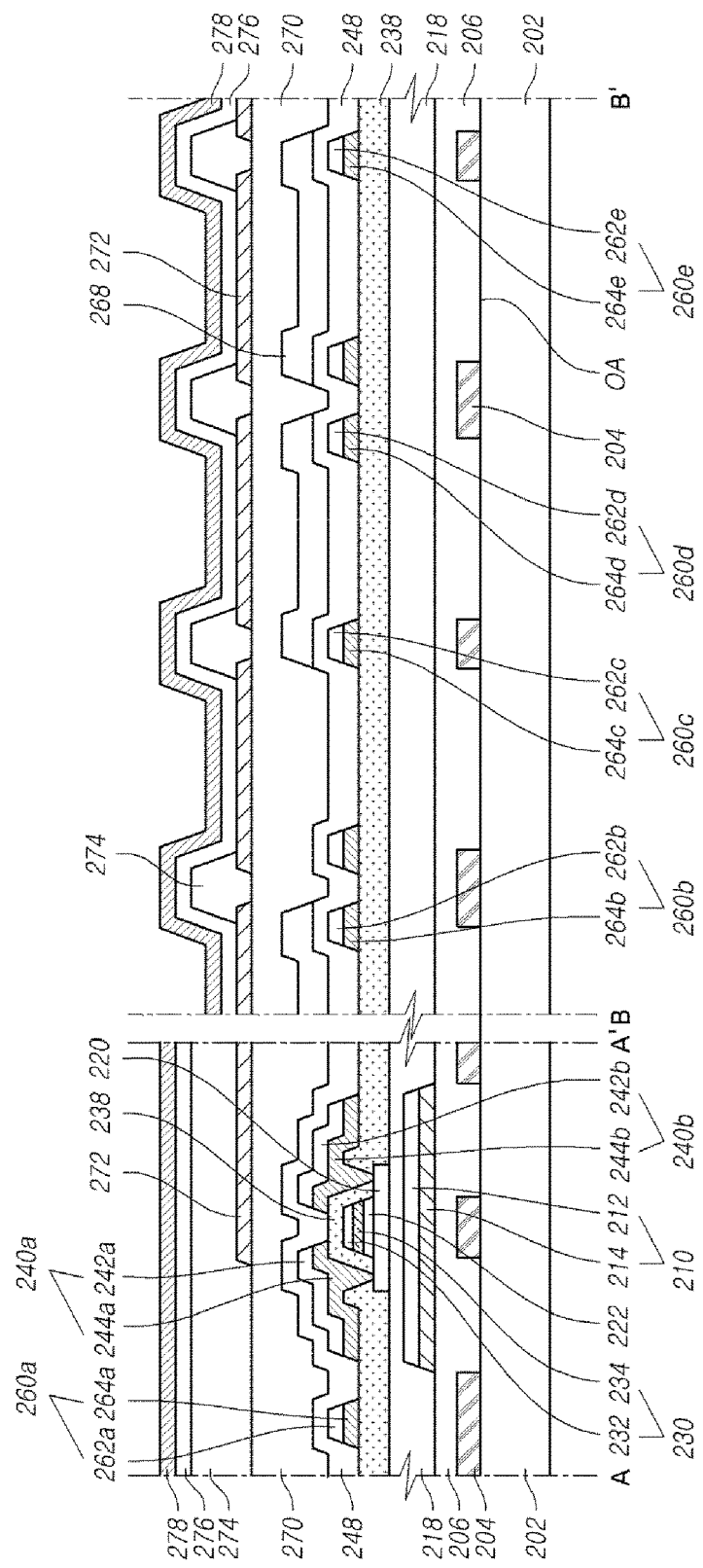
Figure 5C:
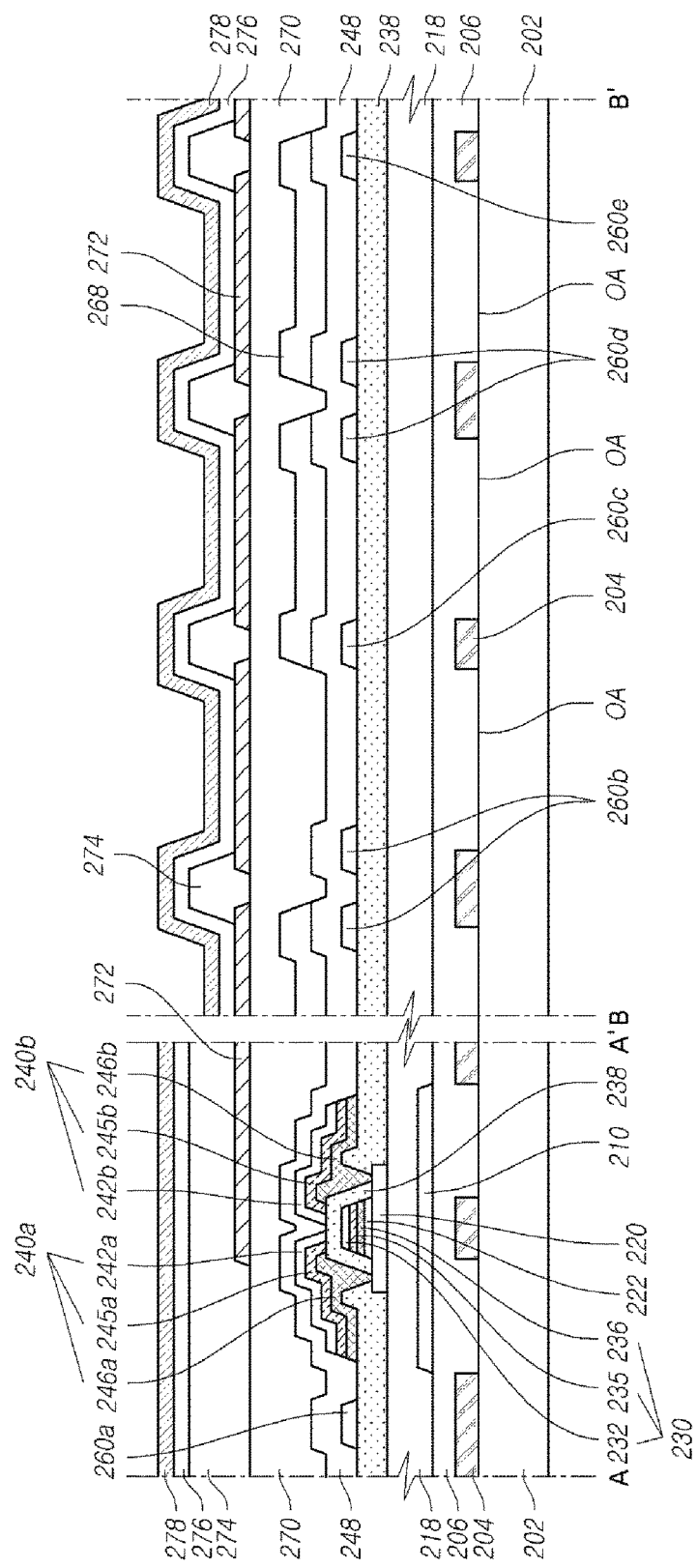

FIGS. 5A through 5C are schematic sectional views of an OLED panel that is cut along A-A' and B-B' of FIG. 2, according to other embodiments of the present invention.

In FIGS. 5A through 5C, A-A' is a sectional view of the first line 260a and the first transistor T21 of the OLED panel 200 of FIG. 2, and B-B' is a sectional view of sub pixels of FIG. 2 cut in a first direction.

Referring to FIGS. 5A through 5C, the OLED panel 200 may have a structure of a bottom emission scheme.

Sub-pixels may emit light having colors of red, blue, green, white, or the like, respectively, and represent the OLED panel 200 designed to be symmetric. In addition, each sub-pixel may be divided into an area that emits light and an area where a transistor (DT, SENT, and SWT), a storage capacitor (Cstg), or the like is formed. This is merely for ease of description, and the OLED panel 200 according to embodiments of the present invention may not be limited thereto and may be variously designed.

As shown in the part of A-A' of FIG. 3, the OLED panel 200 is formed on the substrate 202, and may include the black matrix 204 including an OA, a first overcoat layer 206 formed to cover the black matrix 204, the shielding layer 210 formed on the first overcoat layer 206, a first insulating layer 218 formed on the shielding layer 210, the first transistor (DT) and the first line 260a formed on the first insulating layer 218, the pixel electrode 272 disposed on the first transistor (DT), the bank 274 formed to cover the pixel electrode 272, and an organic layer 276 and a common electrode 278, sequentially formed on the bank 274.

Here, the first transistor (DT) of the OLED panel 200 may be, for example, an oxide transistor, but this may not be limited thereto. In addition, the first transistor (DT) may include a first semi-conductive layer 220, a second insulating layer 222 formed on the first semi-conductive layer 220, the first gate electrode 230 formed on the second insulating layer 222, a third insulating layer 238 formed on the first gate electrode 230, and the first source electrode 240b or the first drain electrode 240a which is formed on the third insulating layer 238 and is connected to the first semi-conductive layer 220 through a contact hole. Here, the second insulating layer 222 may be a gate insulating layer that insulates the first gate electrode 230 and the first semi-conductive layer 220.

The OLED panel 200 may include the first line 260a, a fourth insulating layer 248 formed on the first source electrode 240b and the first drain electrode 240a, and a second overcoat layer 270 formed on the fourth insulating layer 248.

The substrate 202 may be a plastic substrate including polyethylene terephthalate (PET), polyethylene naphthalate (PEN), and polyimide, as well as a glass substrate.

The first semi-conductive layer 220 of the first transistor (DT) may be formed of a metal oxide, and, for example, may be one of indium gallium zinc oxide (IGZO), indium gallium oxide (IGO), indium zinc oxide (IZO), indium zinc oxide (IZO), zinc tin oxide (ZTO), indium hafnium zinc oxide (IHZO), and indium zirconium oxide (IZZO).

The electric or chemical properties of the first semi-conductive layer 220 may be changed by light introduced from the outside and thus, the first shielding layer 210 may be formed in the lower portion of the first semi-conductive layer 220. The first shielding layer 210 may be disposed between the substrate 202 and the semi-conductive layer 220 of the first transistor (T21), and may be formed to correspond to the conductive layer 220 of the first transistor (DT). The first shielding layer 210 may protect the first semi-conductive layer 220 from light introduced from the outside.

The OA formed on the substrate 202 may be a marker for repair, and accordingly, may be formed to correspond to at least a part of the first shielding layer 210. The OA of the black matrix 204 may not be limited to a structure shown in the drawing, and may be formed to have various structures and areas. Here, the OA denotes the open area of the black matrix 204. The first shielding layer 210 may protect the first semi-conductive layer 220 of the first transistor (DT) from light introduced from the outside, which is non-polarized light that enters through the OA.

The black matrix 204 may be the bank 274, formed of organic compounds having heat tolerance. For example, the bank 274 may be a high polymer of the polyimide family or a high polymer of the siloxane family, but is not to be limited thereto.

Light introduced through an OA from the outside may be reflected by electrodes 230, 240a, and 240b of the first transistor (DT) and thus, there may be a drawback in that visibility is deteriorated and brightness and contrast ratio properties are deteriorated.

To prevent the above drawbacks, the entirety of the electrodes 230, 240a, and 240b of the first transistor (DT) or a part exposed through an OA may have a multi-layer structure formed of a conductive layer 242a and 242b and one or more low reflective layers 244a and 244b.

Here, one or more low reflective layers 244a and 244b may be formed of a material that absorbs light introduced from the outside through the substrate 202 or may be coated with a light absorbent material. In addition, the low reflective layer 244a and 244b may be formed of a metallic oxide, a metal that absorbs light, or an alloy thereof.

Although FIG. 5A illustrates only a case in which a single low reflective layer 244a and 244b is formed, embodiments may not be limited thereto, and includes a multi-layer structure. In addition, although FIG. 5A illustrates the OLED panel 200 when a low reflective layer 244a and 244b is formed on the first drain electrode 240b and the first source electrode 240a, the present invention may not be limited thereto, and a low reflective layer may be formed on the first gate electrode 230 and the first shielding layer 210.

The conductive layer 242a and 242b may be, for example, one of Al, Pt, Pd, Ag, Mg, Au, Ni, Nd, Ir, Cr, Li, Ca, Mo, Ti, W, and Cu, or an alloy thereof.

The low reflective layer 244a and 244b may be formed of a material that absorbs light that is introduced from the outside, may be coated with a light absorbent, or may be formed of a metallic oxide.

In particular, the low reflective layer 244a and 244b may be a metallic oxide, for example, indium tin (ITO), indium zinc oxide (IZO), or the like. Light introduced from the outside may be classified into light that is reflected from an interface of the low reflective layer 244a and 244b and light that passes through the low reflective layer 244a and 244b and is reflected from an interface of the conductive layer 242a and 242b. Destructive interference may occur between the light reflected from different interfaces and thus, the light introduced from the outside does not return to the outside of the OLED panel 200. Accordingly, a decrease in the visibility caused by the light introduced from the outside may be prevented.

In addition, the low reflective layer 244a and 244b may be formed of a material that absorbs light and has a color similar to black. For example, the low reflective layer 244a and 244b may be one of Mo, Cr, Ti, Nb, Mn, and Ta, or an alloy thereof. However, embodiments are not be limited thereto, and may include another metal that absorbs light. Accordingly, the light introduced from the outside may be prevented from being reflected again to the outside.

Although not illustrated in FIG. 5A, the second gate electrode 252 of the second transistor (SENT) of FIG. 2, the second source electrode 256b and the second drain electrode 256a, and the third gate electrode 252 of the third transistor (SWT), and the third source electrode 258b and the third drain electrode 258a, may also be formed of a conductive layer and one or more low reflective layers.

The first insulating layer 218, the second insulating layer 222, the third insulating layer 238, and the fourth insulating layer 248 may be an inorganic insulating material including one of SiOx, SiNx, SiON, Al2O3, TiO2, Ta2O5, HfO2, ZrO2, BST, and PZT, an organic insulating material including resin of the BCB or acryl family, or a combination thereof.

As illustrated in the part of B-B' of FIG. 3, the OLED panel 200 may include the black matrix 204 that is formed on the substrate 202 and includes a plurality of OAs, the first overcoat layer 206 formed to cover the black matrix 204, the first insulating layer 218 formed on the first overcoat layer 206, the third insulating layer 238 formed on the first insulating layer 218, a plurality of signal lines 260b, 260c, 260d, and 260e formed on the third insulating layer 238, the fourth insulating layer 248 formed on the signal lines, a color filter 268 formed on the fourth insulating layer 248, the second overcoat layer 270 formed on the color filter 268, the pixel electrode 272 formed on the second overcoat layer 270 and located in an EA, the bank 274 that is formed along an edge of the pixel electrode 272, exposes a part of the pixel electrode 272, and is located in an NEA, and the organic layer 276 and the common electrode 278 sequentially layered on the entire area of the pixel electrode 272 and the bank 274.

The pixel electrode 272 may be an anode electrode (positive electrode), may have a relatively high work function value, and may be formed of a transparent conductive material, for example, a metallic oxide such as indium tin oxide (ITO) or indium zinc oxide (IZO), a compound of a metal and an oxide such as ZnO:Al or SnO2:Sb, a conductive polymer such as poly(3-methylthiophen), poly[3,4-(ethylen-1,2-dioxy)thiophen] (PEDT), polypyrrole, and polyaniline, and the like.

The bank 274 generally has a lattice structure of a matrix form, encloses an edge of the pixel electrode 272, and exposes a part of the pixel electrode 272.

The common electrode 278 is formed on the entire area of the organic layer 276, and the common electrode 278 may be a cathode electrode (negative electrode) or may be formed of a material that has a relatively small work function value. In a case of the bottom emission scheme, for example, the second electrode 278 may be a metal or a monolayer or multiple layers of an alloy in which a first metal, for example, silver (Ag), and a second metal, for example, magnesium, are mixed in a predetermined proportion.

The organic light emitting diode of the OLED panel 200 of FIG. 5A may be a white organic light emitting diode that emits light of a white color. Here, the organic light emitting diode includes the pixel electrode 272, the organic layer 276, and the common electrode 278. The entire area of the organic layer of the organic light emitting diode may be coated at once through a single process, which is advantageous. In this instance, the color filter 268 may be included.

The color filter 268 of each sub-pixel may have one of the colors, from among red, blue, and green. In addition, in a case in which a sub-pixel generates the white color, the color filter 268 may not be formed. A disposition of red, blue, and green may be variously formed.

Referring to FIG. 5B, the OLED panel 200 includes a black matrix where a plurality of OAs are formed, and the plurality of OAs may act as a marker for cutting or welding through a laser. Light may enter into the OLED panel 200 from the outside through the OA. To prevent a decrease in the visibility and a decrease in brightness and contrast ratio properties, the following structure may be included.

At least one of a plurality of signal lines 260a, 260b, 260c, 260d, and 260e, the first gate electrode 230 of the first transistor (DT), the first source electrode 240b, the first drain electrode 240a, and the first shielding layer 210 may have a multi-layer structure formed of a conductive layer 262a, 262b, 262c, 262d, 262e, 232, 242a, 242b, and 212 and one or more low reflective layers 264a, 264b, 264c, 264d, 264e, 234, 244a, 244b, and 214.

The low reflective layer 264a, 264b, 264c, 264d, 264e, 234, 244a, 244b, and 214 may be formed of metal having a color similar to black, which absorbs light. In this instance, the low reflective layer absorbs light introduced from the outside so as to prevent reflection.

In addition, the low reflective layer 264a, 264b, 264c, 264d, 264e, 234, 244a, 244b, and 214 may be formed of a metallic oxide. In this instance, destructive interference may occur between light that passes through the metallic oxide and is reflected from an interface of the conductive layer 262a, 262b, 262c, 262d, 262e, 232, 242a, 242b, and 212 and light that is reflected from a surface of the metallic oxide, and thus, reflection of the light introduced from the outside may be prevented.

Each low reflective layer 264a, 264b, 264c, 264d, 264e, 234, 244a, 244b, and 214 may be formed of an identical material, and may be formed of different materials.

Referring to FIG. 5C, at least one of the first gate electrode 230 of the first transistor (DT) of the OLED panel 200, the first source electrode 240b, and the first drain electrode 240a may include the conductive layer 232, 242a, and 242b, the first low reflective layer 235, 245a, and 245b, and the second low reflective layer 236, 246a, and 246b.

Here, the first low reflective layer 235, 245a, and 245b may be formed of a metallic oxide such as ITO or IZO, and the second low reflective layer 236, 246a, and 246b may be formed of a material that absorbs light, for example, metal having a color similar to block.

In this instance, light introduced from the outside is absorbed into the second low reflective layer 236, 246a, 246b, and may disappear. In addition, the light may disappear due to destructive interference caused by the first low-reflective layer 235, 245a, and 245b. In other words, when light that is not absorbed into the second low reflective layer 236, 246a, and 246b arrives at the first low reflective layer 235, 245a, and 245b, the destructive interference may occur between light reflected from the first low reflective layer 235, 245a, and 245b and light reflected from the conductive layer 232, 242a, and 242b and thus, the reflection of the light introduced from the outside may be diminished.

Figure 6:
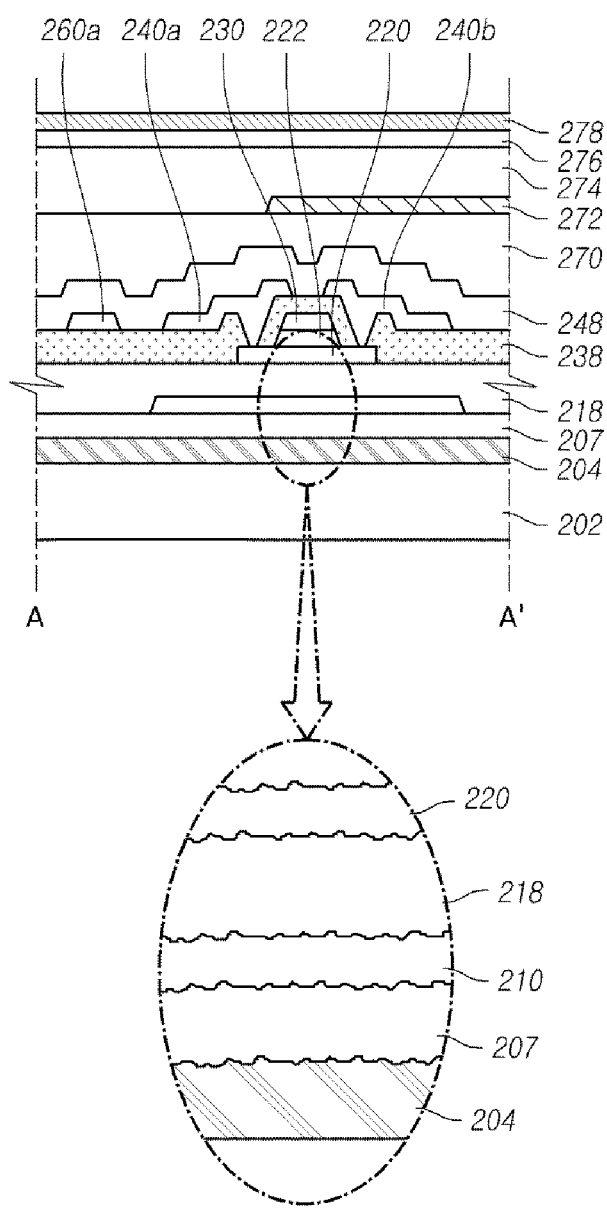
FIG. 6 is a schematic sectional view of a general OLED panel.
Figure 7A:
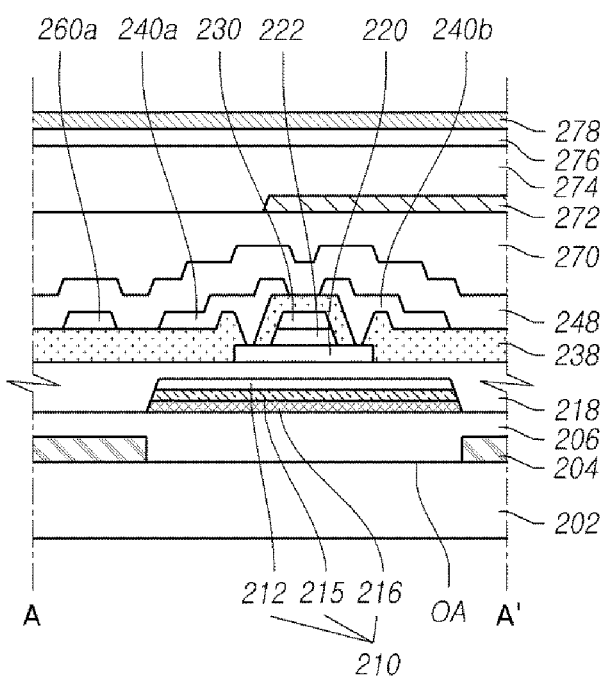
FIG. 7A is a schematic sectional view of an OLED panel according to another embodiment of the present invention.
Figure 7B:
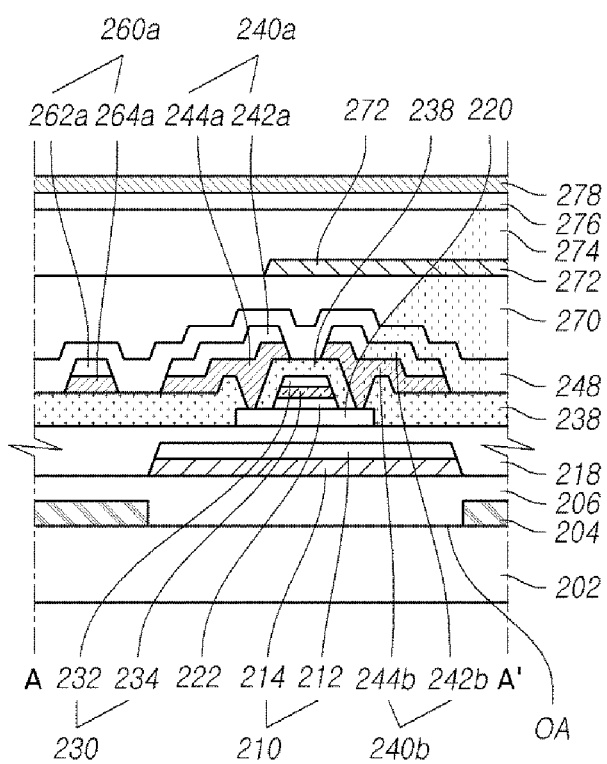
FIG. 7B is a schematic sectional view of an OLED panel according to another embodiment of the present invention.

FIG. 6 is a schematic sectional view of a general OLED panel, FIG. 7A is a schematic sectional view of an OLED panel according to another embodiment of the present invention, and FIG. 7B is a schematic sectional view of an OLED panel according to another embodiment of the present invention.

FIGS. 6 through 7B are sectional views of a part corresponding to A-A' of FIG. 2, and descriptions associated with the structures identical to the above described structures will be omitted.

Referring to FIG. 6, the OLED panel 200 includes the black matrix 204 in which an OA is not formed, a buffer layer 207 formed on the black matrix 204, a first transistor (DT), the pixel electrode 272, the organic layer 276, and the common electrode 278. When the OA of the black matrix 210 does not exist, the shielding layer 210 may be omitted.

The black matrix may have a property of high resistance, and may be formed of organic compounds having heat tolerance. A binder may be added during a manufacturing process of the black matrix 204, and when a patterning process and a high temperature curing process are executed, a binder of a surface may be removed and the surface of the black matrix 204 may become uneven. In other words, there may be a problem in that the surface of the black matrix 204 becomes uneven.

In this instance, as shown in the enlarged view in FIG. 6, the shape of the surface of the black matrix 204 may be transcribed into the shapes of the surfaces of the buffer layer 207, the first shielding layer 210, the first insulating layer 218, the first semi-conductive layer 220, and the like, which are disposed on the black matrix 204.

In particular, when the shape of the surface of the semi-conductive layer 220 is uneven, as a movement distance of an electron becomes longer, a mobility of an electron becomes lower and thus, the electric properties of the first transistor (DT) may be deteriorated.

Hereinafter, with reference to FIGS. 7A and 7B, descriptions will be provided by comparing the OLED panel 200 of FIG. 6 and the OLED panel 200 according to other embodiments of the present invention.

The black matrix 204 of the OLED 200 may include an OA which is formed to correspond to the first semi-conductive layer 220. Accordingly, the black matrix 204 having an uneven surface does not exist in a lower portion of the first semi-conductive layer 220 and thus, the surface of the first semi-conductive layer 220 may be formed to be even. In addition, the overcoat layer 206 for offsetting a rough surface of the black matrix 204 may be replaced with a buffer layer or the like which is relatively thin.

Light introduced from the outside through the OA may be reflected from the electrodes 230, 240a, and 240b of the first transistor (DT), and thus, visibility and brightness may be deteriorated and the electric properties of the first semi-conductive layer 220 may be deteriorated. Accordingly, the shielding layer 210 may be formed in an area corresponding to the OA and the semi-conductive layer 220.

In addition, the electrodes 230, 240a, 240b of the first transistor (DT) and the shielding layer 210 may be formed of a conductive layer 232, 242a, 242b, and 212 and a lower-reflective layer 234, 244a, 244b, and 214, as shown in FIG. 7B. In addition, as shown in FIG. 7A, the electrodes 230, 240a, 240b of the first transistor (DT) and the shielding layer 210 may be formed of the conductive layer 232, 242a, 242b, and 212, the first low reflective layer 235, 245a, 245b, and 215, and the second low reflective layer 236, 246a, 246b, and 216.

According to another aspect, the OLED device 100 according to the present invention may include a display panel 200 in which a plurality of pixels (P) are formed at every point where a plurality of data lines (DL) and a plurality of gate lines (GL) intersect, and a black matrix in which an EA OA that exposes an EA of each pixel. Here, at least one pixel (P) of which a part of a pattern 250, 252, 254, 260a, 260b, 260c, 260d, 260e, 230, 252, 240a, 240b, 256a, 256b, 258a, and 258b is cut may exist among the plurality of pixels, and an NEA OA that exposes a part of the pattern 250, 252, 254, 260a, 260b, 260c, 260d, 260e, 230, 252, 240a, 240b, 256a, 256b, 258a, and 258b, which is cut, may be further formed in the black matrix 204.

Here, the NEA OA may indicate the above described OAs (OAs, OA1 through OA5). Conversely, the EA OA may indicate an OA that is formed to correspond to an EA in the black matrix 204, and is used for executing an original function for light emission.

The pattern 250, 252, 254, 260a, 260b, 260c, 260d, 260e, 230, 252, 240a, 240b, 256a, 256b, 258a, and 258b, which is cut, may be a pattern 250, 252, 254, 260a, 260b, 260c, 260d, 260e, 230, 252, 240a, 240b, 256a, 256b, 258a, and 258b, which is repaired through a plurality of NEA OAs (OAs, OA1 through OA5) acting as an indicator.

Figure 8:
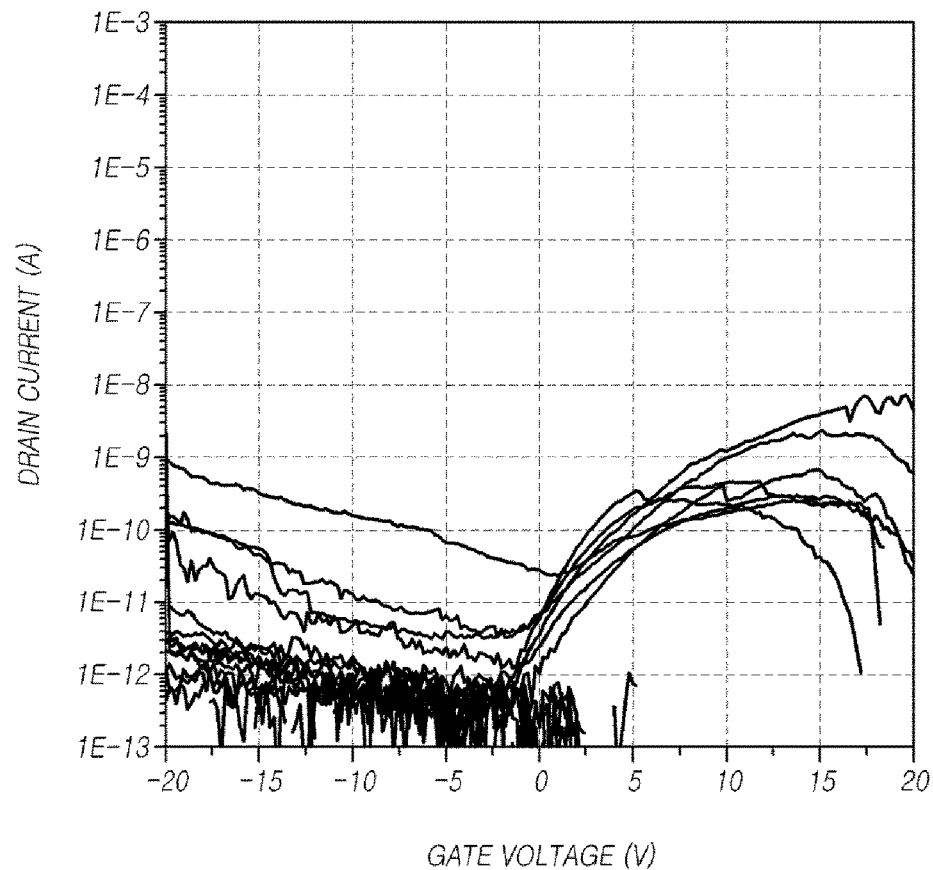
FIG. 8 is a graph illustrating I-V evaluation associated with a transistor of an OLED panel according to another embodiment of the present invention.

FIG. 8 is a graph illustrating I-V evaluation associated with a transistor of an OLED panel according to another embodiment of the present invention.

FIG. 8 is a graph illustrating a relationship between a drain current flowing through the first drain electrode 240a of the first transistor (DT) of the OLED panel 200 and a gate voltage provided to the first gate electrode 230.

As illustrated in FIG. 8, the electric properties of the first transistor (DT) are not implemented well. For example, when a voltage is 5V, a drain current flowing through the first drain electrode 240a is approximately e-10A, which is meager. Accordingly, in this instance, there is a drawback in that a driving voltage of a pixel (P) becomes relatively higher.

This indicates that the uneven surface of the black matrix 204 is transferred to upper layers and the property of a transistor (DT) is deteriorated.

Accordingly, as illustrated in FIGS. 7A and 7B, when an OA corresponding to the semi-conductive layer 220 is formed on the black matrix 204, the electric properties of the transistor (DT) may be improved.

Figure 9B:
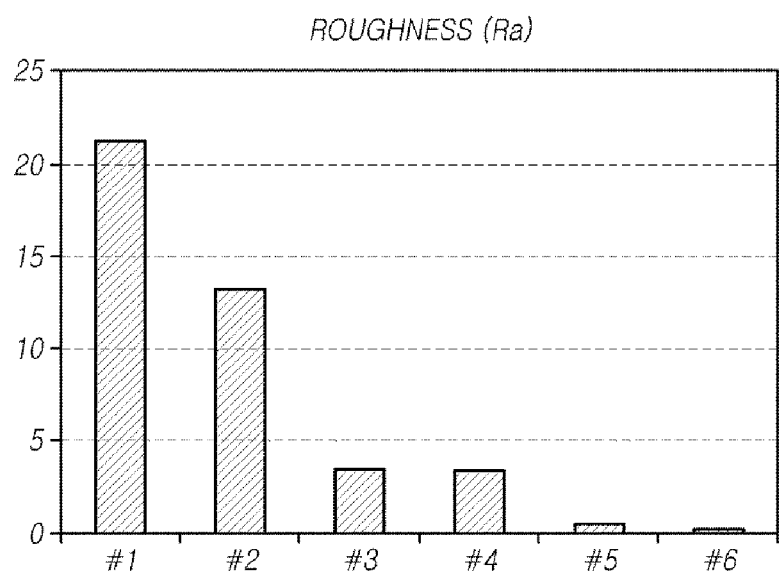

FIGS. 9A and 9B are a table and a graph showing roughness, which is different for each type of black matrix of an OLED panel according to another embodiment of the present invention.

FIGS. 9A and 9B are a table and a graph associated with roughness of a surface of an upper portion of the black matrix 204, measured before the upper layer of the black matrix 204 is formed after the black matrix 204 of the OLED panel 200 is formed. However, in cases of a fifth sample (#5) and a sixth sample (#6), the shielding layer 210 is formed by assuming an area where an OA of the black matrix 204 is formed.

Referring to FIGS. 9A and 9B, a first sample (#1) is the black matrix 204 that is about 4000 μm thick and corresponds to the polyimide family, and a second sample (#2) is the black matrix 204 that is about 4000 μm thick and is formed by etching a material of the siloxine family. In addition, a third sample (#3) is the black matrix 204 that is about 12000 μm thick and is formed by executing a photolithography process on a material of the siloxine family, and a fourth sample (#4) is the black matrix 204 that is about 5000 μm thick and is formed by executing a photolithography process on a material of the siloxine family. In addition, the fifth sample (#5) is the shielding layer 210 formed in a triple-layer structure of MoTi/ITO/MoTi (30/500/30 μm thick each), and the sixth sample (#6) is the shielding layer 210 formed in a quadruple-layer structure of MoTi/ITO/MoTi/ITO (300/500/70/500 μm thick each). Here, the black matrix 204 of each sample is formed of organic compounds having heat tolerance.

Ra of FIG. 9A denotes an arithmetic mean roughness, which is an arithmetic mean value of heights that are higher than a reference height. In addition, Rq is a standard deviation of a surface roughness, and is obtained by calculating a root value after adding up all of the squared values of the heights and calculating a mean value.

In the cases of the fifth sample (#5) and the sixth sample (#6) corresponding to an area of an OA of the black matrix 204, Ra and Rq values are less than or equal to 0.6 nm, and it is recognized that a uniformity of a surface is dramatically improved in comparison with the first (#1) through fourth (#4) samples.

Accordingly, when the surfaces of the lower layers of the semi-conductive layer 220, which is a component of the first transistor (DT), are even, a surface property of the semi-conductive layer 220 may be improved. Accordingly, the electric properties of the OLED panel 200 may be improved.

Therefore, in a case of the OLED panel 200 according to the present invention, a plurality of OAs exist in the black matrix 200 and thus, a location of cutting or welding may be recognized when a pixel malfunctions. In addition, when an OA is located in a lower portion of the semi-conductive layer 220 of a transistor (DT, SENT, and SWT), uniformity of a surface of the semi-conductive layer 220 is improved and thus, the electric properties of the transistor (DT, SENT, and SWT) are improved. In this instance, a decrease in visibility or a decrease in brightness and contrast ratio properties may be prevented by forming a low reflective layer in a part that is exposed through the OA.

Although various embodiments have been described up to now with reference to the accompanying drawings, the present invention is not limited to them.

Further, the terms "includes", "constitutes", or "has" mentioned above mean that a corresponding structural element is included unless they have no reverse meaning. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although the embodiments of the present invention have been described for illustrative purposes, those skilled in the art will appreciate that various modifications, additions and substitutions are possible, without departing from the scope and spirit of the invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

DESCRIPTION OF REFERENCE NUMERALS

200: organic light emitting display panel
202: substrate

What is claimed is:

1. An organic light emitting display panel, comprising:
a substrate comprising an emission area and a non-emission area;
a black matrix disposed on the non-emission area of the substrate and comprising at least one open area;
a first overcoat layer formed on the black matrix;
a first insulating layer formed on the first overcoat layer;
a plurality of transistors formed on the first insulating layer, each of the transistors comprising a semi-conductive layer, a gate electrode, a drain electrode and a source electrode;
a second insulating layer formed on the semi-conductive layer;
a plurality of signal lines formed on the second insulating layer, where the at least one open area exposes at least a portion of a signal line where the open area is a marker for location of pixel repair, and where the plurality of lines contains redundant lines for an identical function;
a third insulating layer formed on the signal lines;
a second overcoat layer formed on the third insulating layer;
a pixel electrode formed on the second overcoat layer and located in an emission area;
a bank formed along an edge of the pixel electrode exposes a part of the pixel electrode and is located in a non-emission area; and
a common electrode layered on the entire area of the pixel electrode and the bank,
wherein: the plurality of transistors comprises a driving transistor which drives the pixel electrode, a sensing transistor which is connected between a storage capacitor and a reference voltage line, and a switching transistor which is connected between a data line and a gate electrode of the driving transistor,
a first open area exposes a drain electrode of the driving transistor, a second open area exposes a drain electrode of the sensing transistor, a third open area exposes a drain electrode of the switching transistor, and the at least one open area exposes a portion of a gate line which is connected to at least one of a gate electrode of the sensing transistor and a gate electrode of the switching transistor,
the signal line or the exposed portion of the signal line comprises a multi-layer structure comprising a conductive layer and at least one low reflective layer,
the at least one open area overlaps with at least a portion of a shielding layer formed between the first overcoat layer and one of the plurality transistors, and
the shielding layer comprises a conductive layer, a first low reflective layer formed on the conductive layer and comprising a metallic oxide, and a second low reflective layer formed on the first low reflective layer and comprising a material that absorbs light introduced from outside the substrate.

2. The organic light emitting display panel according to claim 1, wherein the light introduced through the substrate is non-polarized light.

3. The organic light emitting display panel according to claim 1, wherein the black matrix comprises heat-tolerant organic matter.

4. The organic light emitting display panel according to claim 1, wherein the plurality of lines containing redundant lines for an identical function are exposed through the open area.

5. An organic light emitting display panel, comprising:
a substrate comprising an emission area and a non-emission area;
a black matrix disposed on the non-emission area of the substrate and comprising at least one open area exposing an emission area of each of a plurality of pixels formed at intersection points between a plurality of data lines and a plurality of gate lines;
a first overcoat layer formed on the black matrix;
a first insulating layer formed on the first overcoat layer;
a plurality of transistors formed on the first insulating layer, each of the transistors comprising a semi-conductive layer, a gate electrode, a drain electrode and a source electrode; and
a second insulating layer formed on the semi-conductive layer, wherein:
the plurality of transistors comprises a driving transistor which drives a pixel electrode, a sensing transistor which is connected between a storage capacitor and a reference voltage line, and a switching transistor which is connected between a data line and a gate electrode of the driving transistor,
at least one pixel from the plurality of pixels is a pixel from which a portion of a pattern is cut,
the black matrix further comprises open areas disposed on the non-emission area exposing the cut portion, exposing a drain electrode of the driving transistor, exposing a drain electrode of the sensing transistor, exposing a drain electrode of the switching transistor, and exposing a portion of a gate line which is connected to at least one of a gate electrode of the sensing transistor and a gate electrode of the switching transistor, the at least one open area exposes a portion of a signal line formed on the substrate and is a marker for location of pixel repair, a plurality of signal lines formed on the substrate contains redundant lines for an identical function, and the at least one open area overlaps with at least a portion of a shielding layer formed between the first overcoat layer and one of the plurality of transistors, where the shielding layer comprises a conductive layer, a first low reflective layer formed on the conductive layer and comprising a metallic oxide, and a second low reflective layer formed on the first low reflective layer and comprising a material that absorbs light introduced from outside the substrate.

6. The organic light emitting display panel according to claim 5, wherein the light introduced through the substrate is non-polarized light.

7. The organic light emitting display panel according to claim 5, wherein the black matrix comprises heat-tolerant organic matter.

8. The organic light emitting display panel according to claim 5, wherein the plurality of lines containing redundant lines for an identical function are exposed through the open area.

* * * * *